(12) United States Patent
Fukuda et al.

(10) Patent No.: US 8,361,372 B2
(45) Date of Patent: Jan. 29, 2013

(54) METHOD OF FORMING PATTERN AND METHOD OF PRODUCING ELECTRONIC ELEMENT

(75) Inventors: Toshio Fukuda, Kanagawa (JP); Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 206 days.

(21) Appl. No.: 12/593,846

(22) PCT Filed: Jan. 10, 2008

(86) PCT No.: PCT/JP2008/050215
§ 371 (c)(1),
(2), (4) Date: Sep. 29, 2009

(87) PCT Pub. No.: WO2008/126425
PCT Pub. Date: Oct. 23, 2008

(65) Prior Publication Data
US 2010/0044905 A1    Feb. 25, 2010

(30) Foreign Application Priority Data
Mar. 30, 2007   (JP) ................ 2007-092178

(51) Int. Cl.
*B29C 41/46*   (2006.01)
(52) U.S. Cl. ...................................... 264/319
(58) Field of Classification Search ........... 264/319
See application file for complete search history.

(56) References Cited

FOREIGN PATENT DOCUMENTS

| JP | 11-058921 | 3/1999 |
|---|---|---|
| JP | 2005-056736 | 3/2005 |
| JP | 2005-126608 | 5/2005 |
| JP | 2005-246790 | 9/2005 |
| JP | 2006-045294 | 2/2006 |

OTHER PUBLICATIONS

International Search Report issued on Mar. 30, 2007.

*Primary Examiner* — Larry Thrower
(74) *Attorney, Agent, or Firm* — SNR Denton US LLP

(57) ABSTRACT

A method of forming a pattern and a method of producing an electronic element with which a fine and precise pattern is stably formed are provided. Each of the method of forming a pattern and the method of producing an electronic element includes a step of forming an electrically conductive film D by applying a liquid composition onto a first plate 10; a step of forming an electrically conductive pattern D' on the first plate 10 by pressing a second plate 20 onto a surface side of the first plate 10, on which the electrically conductive film D is formed, to transfer an unwanted pattern of the electrically conductive film D to top faces of projections 20a of the second plate 20, thereby removing the unwanted pattern; and a step of transferring the electrically conductive pattern D' by pressing the surface side of the first plate 10, on which the electrically conductive pattern D' is formed, onto a surface of a transfer-receiving substrate, wherein when a surface tension of the surface of the first plate 10, onto which the liquid composition is applied, is represented by $\alpha$, a dynamic surface tension of the liquid composition at 100 msec measured by a maximum bubble pressure method is represented by $\beta$, and a surface tension of the top faces of the projections 20a of the second plate 20 is represented by $\gamma$, the composition of the liquid composition or a material of the surface of the first plate 10 or the second plate 20 is set so as to satisfy $\gamma > \alpha \geq \beta$.

5 Claims, 2 Drawing Sheets

(a)

(b)

(c)

(d)

METHOD OF FORMING PATTERN AND METHOD OF PRODUCING ELECTRONIC ELEMENT

TECHNICAL FIELD

The present invention relates to a method of forming a pattern and a method of producing an electronic element. More specifically, the present invention relates to a method of forming an electrically conductive pattern and a method of producing an electronic element using the same.

BACKGROUND ART

Various methods have been studied in order to efficiently form a fine and precise pattern on a glass substrate, a plastic substrate, or the like at a low cost. For example, a printing method has been disclosed in which a resin to be printed is applied onto the entire surface of a first plate called a blanket, a surface of which is coated with silicone rubber having detachability, and a second plate having a projection-and-recess pattern on a surface side thereof is then pressed onto the surface side of the first plate, on which the resin is provided, to transfer an unwanted pattern of the resin to top faces of projections of the second plate, thereby removing the unwanted pattern, and a resin pattern remaining on the surface of the first plate is transferred to a transfer-receiving substrate (refer to, for example, Japanese Unexamined Patent Application Publication No. 11-58921).

When a fine and precise pattern is formed using this printing method, it is necessary that a liquid composition used therein maintain an appropriate characteristic of the liquid composition, in particular, in the step of applying the liquid composition onto a first plate and the step of transferring an unwanted pattern of a liquid-composition coating film from the first plate to a second plate.

First, in the step of applying the liquid composition onto the first plate, in general, the surface of the first plate is formed of a material having detachability, and a thin, smooth, and uniform liquid-composition coating film must be formed on this surface having detachability. Accordingly, it is necessary to appropriately control a surface tension of the liquid composition.

In addition, in the next step of transferring an unwanted pattern of the liquid-composition coating film from the first plate to the second plate, the liquid-composition coating film applied onto the first plate must be completely transferred with the pattern shape remaining as it is to the top faces of the projections of the second plate to be contacted. For this purpose, it is necessary that not only the liquid composition be prepared but also a material of the surface of the first plate or the surface of the second plate be set so that the adhesiveness of the top faces of the projections of the second plate to the liquid-composition coating film is higher than that of the surface of the first plate to the liquid-composition coating film.

To cope with these technical problems, an example of an ink composition for a precise patterning in which a surface energy of a liquid composition is specified so as to be smaller than a surface energy of a blanket (first plate) by setting a viscosity value and the surface energy value of the ink composition (liquid composition) used in printing has been disclosed (refer to, for example, Japanese Unexamined Patent Application Publication No. 2005-126608).

However, the surface energy specified in Japanese Unexamined Patent Application Publication No. 2005-126608 is a value determined when the liquid composition is in a motionless state. In the step of applying the liquid composition onto the first plate, a motion that the liquid composition is applied is performed, and thus a specification in which the motion is considered is necessary. Therefore, even though the surface energy of the liquid composition is specified so as to be smaller than the surface energy of the first plate, a liquid-composition coating film is not reliably formed on the first plate, and a defective portion may be generated. Accordingly, there is a problem that even though the printing method described above is employed, it is difficult to stably form a fine and precise pattern.

In order to solve the problems described above, it is an object of the present invention to provide a method of forming a pattern and a method of producing an electronic element with which a fine and precise pattern can be stably formed by adjusting physical properties of a liquid composition.

DISCLOSURE OF INVENTION

In order to achieve the object described above, in a method of forming a pattern of the present invention, the following steps are sequentially performed. First, in a first step, a liquid-composition coating film is formed by applying a liquid composition onto a first plate. Next, in a second step, a pattern is formed on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern. Subsequently, in a third step, the pattern is transferred to a surface of a transfer-receiving substrate by pressing the surface side of the first plate, on which the pattern is formed, onto the surface of the transfer-receiving substrate. Here, the method is characterized in that when a surface tension of the surface of the first plate, onto which the liquid composition is applied, is represented by $\alpha$, a dynamic surface tension of the liquid composition at 100 msec measured by a maximum bubble pressure method is represented by $\beta$, and a surface tension of the top faces of the projections of the second plate is represented by $\gamma$, the liquid composition is prepared and a material of the surface of the first plate or the second plate is set so as to satisfy $\gamma > \alpha \geq \beta$.

According to the method of forming a pattern described above, when the surface tension of the surface of the first plate, onto which the liquid composition is applied, is represented by $\alpha$, the dynamic surface tension of the liquid composition at 100 msec measured by the maximum bubble pressure method is represented by $\beta$, and the surface tension of the top faces of the projections of the second plate is represented by $\gamma$, $\gamma > \alpha \geq \beta$ is satisfied. Accordingly, in the first step, even when a motion that the liquid composition is applied onto the first plate is performed, by specifying as in the above formula using the dynamic surface tension, the liquid-composition coating film is reliably formed on the first plate. In addition, since $\gamma > \alpha$ is satisfied, in the second step, an unwanted pattern of the liquid-composition coating film on the first plate can be reliably transferred to the top faces of the projections of the second plate.

Furthermore, the method of producing an electronic element in the present invention is characterized in that the above-described method of forming a pattern is applied to a method of producing an electronic element. Accordingly, a liquid-composition coating film can be reliably formed on a first plate, and an unwanted pattern of the liquid-composition coating film on the first plate can be reliably transferred to top faces of projections of a second plate.

As described above, according to the method of forming a pattern of the present invention and the method of producing an electronic element using the same, a liquid-composition coating film can be reliably formed on a first plate, and an unwanted pattern of the liquid-composition coating film on the first plate can be reliably transferred to top faces of projections of a second plate, and therefore, a fine and precise pattern can be formed. Accordingly, a fine electrode pattern of an electronic element can be formed by a printing method, and a process of producing an electronic element can be simplified.

BEST MODES FOR CARRYING OUT THE INVENTION

An embodiment of the present invention will now be described in detail on the basis of the drawings.

Figure 1:
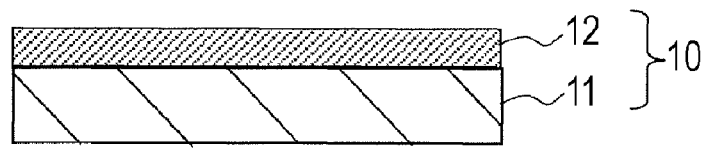
FIG. 1 includes production-process cross-sectional views (part 1) illustrating a method of producing an electronic element according to an embodiment of the present invention.
Figure 1:
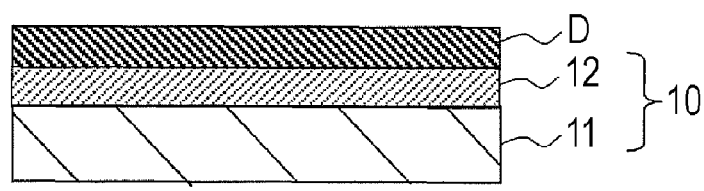
Figure 1:
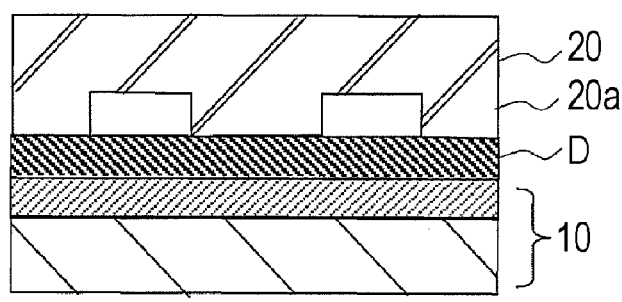
Figure 1:
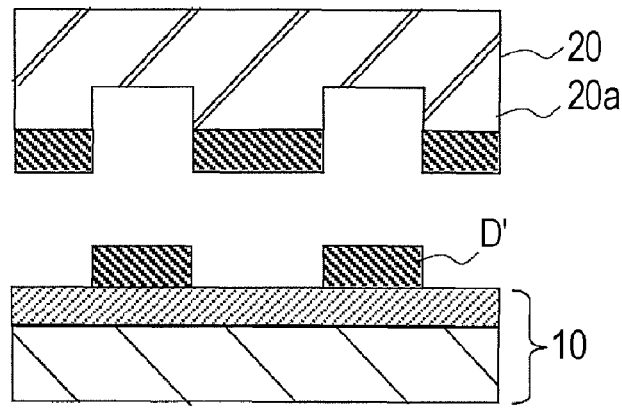

An example of a method of forming a pattern according to an embodiment of the present invention will be described with reference to production-process cross-sectional views of FIG. 1 using a method of producing an electronic element including a bottom gate/bottom contact-type thin-film transistor as an example. In this embodiment, the method of forming a pattern of the present invention is applied to a formation of source/drain electrodes of the thin-film transistor.

As shown in FIG. 1(a), a first plate 10 serving as a blanket is constituted by a flat plate including a glass substrate 11 and, for example, a polyolefin resin layer 12 provided on the glass substrate 11. This first plate 10 is prepared by applying a polyolefin resin onto the glass substrate 11 by thermocompression bonding using, for example, a hot-pressing method, and the polyolefin resin layer 12 is provided so that the surface side thereof is flat. Here, the surface tension of a surface of the first plate 10, onto which a liquid composition is applied in a subsequent step, that is, the surface tension of the polyolefin resin layer 12 is 30 mN/m.

Furthermore, the liquid composition to be applied onto the first plate 10 contains a solute and a solvent that disperses or dissolves the solute. Here, a liquid composition in which electrically conductive particles composed of, for example, silver nanoparticles are dispersed in an organic solvent, e.g., xylene is used.

In addition, when a surface tension of the surface of the first plate 10, onto which the liquid composition is applied, is represented by $\alpha$ (mN/m) and a dynamic surface tension of the liquid composition at 100 msec measured by a maximum bubble pressure method is represented by $\beta$ (mN/m), the composition of the above liquid composition or a material of the surface of the first plate 10 is set so as to satisfy $\alpha \geq \beta$.

Herein, the maximum bubble pressure method is a method of measuring a surface tension value by immersing a capillary composed of glass or the like into a liquid to be measured, allowing a bubble to be formed from a leading end of the capillary, and reading a pressure applied from the liquid to the bubble at the time of the formation of the bubble. The surface tension value measured by this method is referred to as "dynamic surface tension", and a surface tension value measured by a conventional method in which a platinum plate is immersed in a measurement liquid is referred to as "static surface tension". The inventors of the present invention found that when a liquid undergoes a motion such as in an application step, the dynamic surface tension is important for wettability with respect to a solid.

Furthermore, in the case where wettability of a liquid is specified by a surface tension, the viscosity of the liquid composition is preferably 50 mPa·s or less. The reason for this is as follows: Wettability of a liquid with respect to a solid is specified by the viscosity and the surface tension of the liquid, and when the viscosity of the liquid is higher than 50 mPa·s, an effect of the viscosity increases and it is difficult to specify the wettability by the surface tension. In addition, a target in this embodiment is to form an electrically conductive pattern D' having a film thickness of 500 nm or less. Also in this point of view, the viscosity of the liquid composition is preferably low. Since the dynamic surface tension of the liquid composition is specified mainly by physical properties of a solvent, the dynamic surface tension of the liquid composition can be adjusted by changing the solvent.

As the solvent constituting the liquid composition, water or most organic solvents can be used. As the organic solvents, polar solvents including ester solvents, alcohol solvents, and ketone solvents; and non-polar solvents can be used in accordance with a printing property. Examples of the ester solvents include methyl acetate, ethyl acetate, and ethyl propionate. Examples of the alcohol solvents include ethanol, propanol, and isopropanol. Examples of the ketone solvent include acetone, methyl ethyl ketone, and methyl isobutyl ketone. Furthermore, examples of the non-polar solvents include hydrocarbon solvents such as pentane, hexane, heptane, octane, decane, dodecane, isopentane, isohexane, isooctane, cyclohexane, methylcyclohexane, and cyclopentane. Furthermore, aromatic solvents such as toluene, xylene, and mesitylene can also be preferably used. By appropriately using these solvents, the dynamic surface tension ($\beta$) of the liquid composition is controlled to be lower than the surface tension ($\alpha$) of the first plate 10. Note that, meanwhile, a material of the first plate 10 may be set so as to satisfy the above relationship.

Note that, here, the liquid composition contains electrically conductive particles composed of silver nanoparticles, but besides silver, electrically conductive particles composed of gold, nickel, copper, or platinum can be used. In general, a coating surface treatment is performed on the surfaces of these electrically conductive particles using a polymer material or the like, and electrically conductive particles dispersed in water or an organic solvent are used. Furthermore, the liquid composition may contain other electrically conductive materials than the electrically conductive particles described above. Note that physical properties of the liquid composition may be controlled by incorporating a resin or a surfactant in the liquid composition in addition to the electrically conductive materials and solvents described above.

As shown in FIG. 1(b), the liquid prepared as described above is applied onto the polyolefin layer 12 of the first plate 10 by, for example, a Cap coating method to form an electrically conductive film D (liquid-composition coating film) having a thickness of, for example, 500 nm. In this case, as described above, the surface tension ($\alpha$) of the first plate 10 and the dynamic surface tension ($\beta$) of the liquid composition satisfy the relationship $\alpha \geq \beta$, the electrically conductive film D is reliably formed without generating a defective portion.

Here, in addition to the Cap coating method described above, examples of the method of applying the liquid composition include a roll coating method, a spray coating method, a dip coating method, a curtain flow coating method, a wire-bar coating method, a gravure coating method, an air knife coating method, a doctor blade coating method, a screen coating method, and a die coating method. The application method is preferably selected in accordance with the shape of the first plate 10 such as a roll shape, a flat plate shape, or the like. Among the above methods, the Cap coating method is particularly preferable because it has a good application property.

Next, as shown in FIG. 1(c), a second plate 20 having a projection-and-recess pattern on a surface side thereof, the second plate 20 being composed of, for example, a glass plate, is pressed onto a surface side of the first plate 10 on which the electrically conductive film D is formed. The projection-and-recess pattern is formed so that a projection pattern is a reverse pattern of an electrically conductive pattern described below. By forming the projection-and-recess pattern of the second plate 20 by etching using an ordinary photolithography technique, a fine and precise projection-and-recess pattern can be formed. Here, the surface tension of the top faces of projections 20a of the second plate 20, that is, the surface tension of the glass plate is 70 mN/m or more.

Here, when the surface tension of the top faces of the projections 20a of the second plate 20 is represented by $\gamma$ (mN/m), a material of the surface of the second plate 20 is set so that the relationship with the surface tension of the surface of the first plate 10 satisfies $\gamma > \alpha$. Accordingly, the surface tension ($\alpha$) of the first plate 10, the dynamic surface tension ($\beta$) of the liquid composition, and the surface tension ($\gamma$) of the second plate 20 satisfy $\gamma > \alpha \geq \beta$.

As described above, when the surface tension ($\gamma$) of the top faces of the projections 20a of the second plate 20 and the surface tension ($\alpha$) of the first plate 10 satisfy the relationship $\gamma > \alpha$, the adhesiveness of the top faces of the projections 20a of the second plate 20 to the electrically conductive film D is higher than that of the surface of the first plate 10 to the electrically conductive film D. Accordingly, as shown in FIG. 1(d), by pressing the second plate 20 onto the surface side of the first plate 10 on which the electrically conductive film D is formed, an unwanted pattern of the electrically conductive film D (see FIG. 1(c) described above) is reliably transferred to the top faces of the projections 20a to form an electrically conductive pattern D' on the first plate 20. Note that the unwanted pattern of the electrically conductive film D transferred to the top faces of the projections 20a is recovered and reused.

Figure 2:
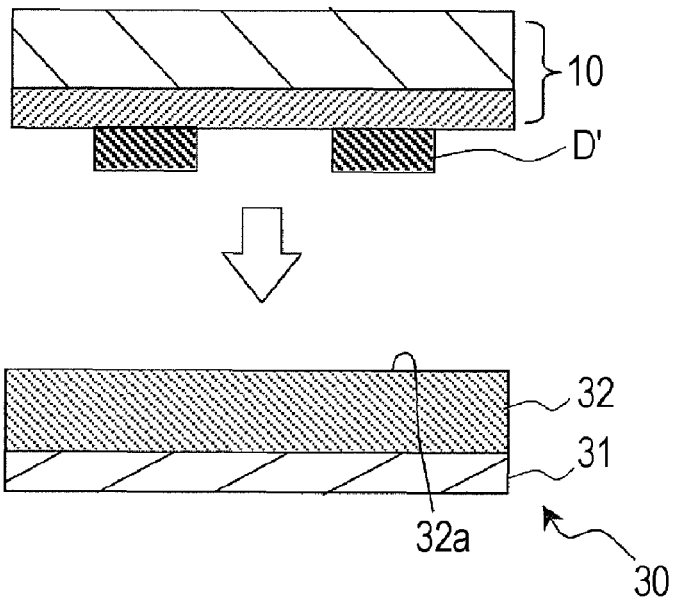
FIG. 2 includes production-process cross-sectional views (part 2) illustrating the method of producing an electronic element according to the embodiment of the present invention.
Figure 2:
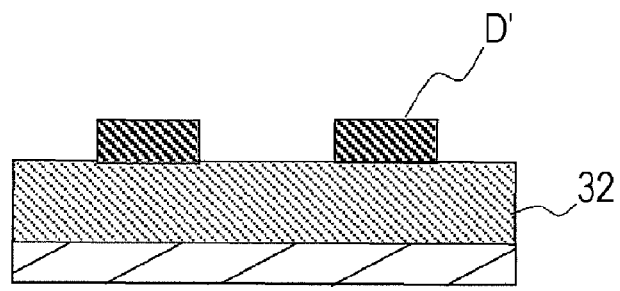
Figure 2:
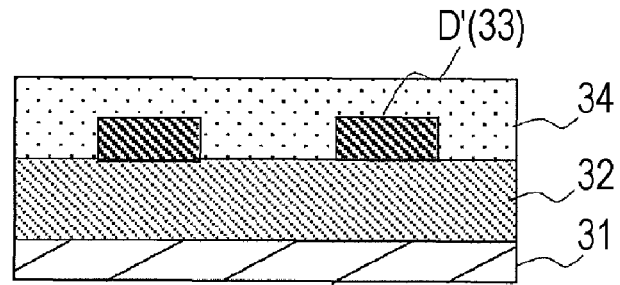

Subsequently, as shown in FIG. 2(e), a surface side of the first plate 10, on which the electrically conductive pattern D' is formed, is pressed onto a transfer-receiving surface of a transfer-receiving substrate 30. Here, the transfer-receiving substrate 30 has a structure in which an insulating film 32 composed of polyvinylphenol (PVP) is provided on a substrate 31 composed of a silicon substrate. Accordingly, a surface 32a of the insulating film 32 functions as the transfer-receiving surface. Here, it is assumed that by highly doping an impurity ion in the substrate 31 composed of the silicon substrate, the substrate 31 also functions as a gate electrode, and the insulating film 32 provided as an upper layer of the substrate 31 constitutes a gate insulating film.

Here, the insulating film 32 is composed of a material having a surface tension lower than the surface tension of the second plate 20 so that the adhesiveness of the surface 32a of the insulating film 32, the surface 32a functioning as the transfer-receiving surface, to the electrically conductive pattern D' is higher than the adhesiveness of the top faces of the projections 20a of the second plate 20 to the electrically conductive pattern D'. Accordingly, by pressing the surface side of the first plate 10, on which the electrically conductive pattern D' is formed, onto the transfer-receiving surface of the transfer-receiving substrate 30, as shown in FIG. 2(f), the electrically conductive pattern D' is transferred to the surface 32a of the insulating film 32.

This electrically conductive pattern D' becomes source/drain electrodes 33. Subsequently, the electrically conductive pattern D' is sintered by heating in, for example, an oven. Here, the film thickness of the electrically conductive pattern D' after sintering is 500 nm or less. Subsequent steps are performed as in a typical process of producing a thin-film transistor. That is, as shown in FIG. 2(g), a semiconductor layer 34 composed of, for example, triisopropylsilylethynyl pentacene is formed on the insulating film 32 by, for example, a spin-coating method so as to cover the source/drain electrodes 33 composed of the electrically conductive pattern D'.

As described above, a bottom gate/bottom transistor-type thin-film transistor in which the insulating film (gate insulating film) 32, the source/drain electrodes 33, and the semiconductor layer 34 are stacked on the substrate (gate electrode) 31 in that order is produced.

According to the method of forming a pattern and the method of producing an electronic element using the same, when the surface tension of a surface of the first plate 10, onto which a liquid composition is applied, is represented by $\alpha$, the dynamic surface tension of the liquid composition at 100 msec measured by a maximum bubble pressure method is represented by $\beta$, and the surface tension of the top faces of the projections 20a of the second plate 20 is represented by $\gamma$, $\gamma > \alpha \geq \beta$ is satisfied. Accordingly, even when a motion that the liquid composition is applied onto the first plate 10 is performed, by specifying as in the above formula using the dynamic surface tension, an electrically conductive film D is reliably formed on the first plate 10. In addition, since $\gamma > \alpha$ is satisfied, an unwanted pattern of the electrically conductive film D on the first plate 10 can be reliably transferred to the top faces of the projections 20a of the second plate 20. Accordingly, a fine and precise electrically conductive pattern D' can be stably formed. In addition, a fine electrically conductive pattern D' of an electronic element can be formed using a printing method, and a process of producing the electronic element can be simplified.

Note that in the embodiment described above, a description has been made of an example in which source/drain electrodes are formed. Alternatively, the present invention can be applied also to, for example, a case where a gate electrode is formed on an insulating substrate. The transistor structure is not limited to the above-described bottom gate/bottom contact-type transistor structure, and the present invention can be applied also to a case where an electrode pattern of another transistor structure is formed. Furthermore, the present invention can be applied to the formation of an electrode pattern of not only a thin-film transistor but also other electronic elements such as a printed wiring board, an RF-ID tag, and various display substrates.

In addition, the present invention is not limited to a method of forming an electrically conductive pattern, and can be applied also to a method of forming an insulating pattern and a method of forming a semiconductor pattern. When the present invention is applied to a method of forming an insulating pattern, as a solute of a liquid composition, organic materials such as polyester resins, acrylic resins, epoxy resins, and melamine resins can be used alone or as a mixture. Furthermore, radical-type ultraviolet curable resins, cation-type ultraviolet curable resins, electron-beam curable resins, and the like can also be appropriately used according to need. As a solvent, the same solvents as those described in the embodiment can be used.

Furthermore, when the present invention is applied to a method of forming a semiconductor pattern, as a solute of a liquid composition, for example, a soluble organic semiconductor material such as triisopropylsilylethynyl pentacene is used. As a solvent, the same solvents as those described in the embodiment can be used. For example, in the above embodiment, in the step of forming the semiconductor layer 34 described with reference to FIG. 2(g), an organic semiconductor layer may be pattern-formed by applying the present invention.

EXAMPLES

Furthermore, specific Examples of the present invention will now be described with reference to FIGS. 1 and 2 again.

Examples 1 and 2

As in the embodiment described above, a first plate 10 (blanket) was prepared by applying a solution containing, as a main component, a resin material shown in Table 1 below onto a glass substrate 11 with a spin coater. Meanwhile, a solution containing, as a main component, a resin material shown in Table 1 below was applied onto a glass substrate to form a resin film. A projection-and-recess pattern was then formed on a surface side thereof by etching using an ordinary lithography technique so that a line-and-space (L/S) was 5 μm, thus forming a second plate 20.

TABLE 1

| | First plate | Second plate | Liquid composition |
|---|---|---|---|
| Example 1 | Polypropylene | Polymethyl methacrylate | Xylene |
| Example 2 | Polystyrene | Polymethyl methacrylate | Tetralin (1,2,3,4-Tetrahydronaphthaline) |
| Comparative Example 1 | Polystyrene | Polymethyl methacrylate | Benzyl alcohol |
| Comparative Example 2 | Polypropylene | Polymethyl methacrylate | Isophorone (3,5,5-Trimethyl-2-cyclohexen-1-one) |
| Comparative Example 3 | Polymethyl methacrylate | Polystyrene | Tetralin |

Next, silver nanoparticles (average particle diameter: 10 nm) which had been surface-treated with oleic acid were dispersed in an amount of 5 weight percent using a solvent shown in Table 1 to prepare a liquid composition. Here, the surface tension (α) of the first plate 10, the dynamic surface tension (β) of the liquid composition, and the surface tension (γ) of the second plate 20 are shown in Table 2. Furthermore, for comparison, the static surface tension (β') of the liquid composition is also shown in Table 2 below.

TABLE 2

| | First plate (α) (mN/m) | Second plate (γ) (mN/m) | Liquid composition (mN/m) | | Viscosity (mPas) |
|---|---|---|---|---|---|
| | | | Dynamic surface tension (β) | Static surface tension (β') | |
| Example 1 | 29 | 44 | 27.2 | 27.0 | 0.7 |
| Example 2 | 40 | 44 | 37.2 | 37.0 | 1.0 |
| Comparative Example 1 | 40 | 44 | 45 | 38 | 7.0 |
| Comparative Example 2 | 29 | 44 | 33 | 28.5 | 2.4 |
| Comparative Example 3 | 44 | 40 | 37.2 | 37.0 | 1.0 |

As shown in Table 2 above, the first plate 10, the second plate 20, and the liquid composition of each of Examples 1 and 2 are set so as to satisfy $\gamma > \alpha \geq \beta$.

Subsequently, by applying the liquid composition onto the first plate 10 with a spin coater, an electrically conductive film D having a thickness of 10 μm was formed. Subsequently, the second plate 20 was pressed onto a surface side of the first plate 10, on which the electrically conductive film D was formed, so that an unwanted pattern of the electrically conductive film D was transferred to projections 20a of the second plate 20 to remove the unwanted pattern. Thus, an electrically conductive pattern D' was formed on the first plate 10.

Meanwhile, a solution in which a cross-linking agent composed of a melamine-formaldehyde resin was added to a PVP resin solution (solvent: PGMEA (propylene glycol monomethyl ether acetate), concentration: 20 weight percent) was applied onto a substrate 31 with a spin coater. Thus, a transfer-receiving substrate 30 having an insulating film 32 composed of PVP thereon was prepared. Next, the surface side of the first plate 10, on which the electrically conductive pattern D' was formed, was pressed onto a transfer-receiving surface of the transfer-receiving substrate 30 to transfer the electrically conductive pattern D' to a surface 32a of the insulating film 32. Subsequently, the electrically conductive pattern D' was fixed at 180° C. for one hour in an oven to sinter the silver nanoparticles. Thus, an electrically conductive wiring pattern in which L/S=5 μm and which had a thickness of 500 nm was formed.

Comparative Examples 1 to 3

Meanwhile, as Comparative Examples 1 to 3 relative to Examples 1 and 2 above, a wiring pattern of L/S=5 μm was formed as in Examples 1 and 2 except that the first plate 10, the second plate 20, and the solvent of the liquid composition were set as shown in Table 1. Note that the relationship between the surface tension (α) of the first plate 10 and the dynamic surface tension (β) of the liquid composition of each of Comparative Examples 1 and 2 is $\alpha < \beta$, and the relationship between the surface tension (α) of the first plate 10 and the surface tension of the second plate of Comparative Example 3 is $\gamma < \alpha$. Thus, none of them satisfy $\gamma > \alpha \geq \beta$. In particular, in Comparative Example 3, the relationship was set so that the static surface tension (β') of the liquid composition satisfied $\alpha \geq \beta'$.

The results of Examples 1 and 2 and Comparative Examples 1 to 3 are shown in Table 3.

TABLE 3

| | |
|---|---|
| Example 1 | Application to the first plate and transfer to the second plate were performed without a problem, and the predetermined wiring pattern could be formed. |
| Example 2 | Application to the first plate and transfer to the second plate were performed without a problem, and the predetermined wiring pattern could be formed. |
| Comparative Example 1 | A defective portion was generated in the electrically conductive film formation on the first plate, and the predetermined wiring pattern could not be formed. |
| Comparative Example 2 | A defective portion was generated in the electrically conductive film formation on the first plate, and the predetermined wiring pattern could not be formed. |
| Comparative Example 3 | Transfer to the second substrate could not be completely performed, and the predetermined wiring pattern could not be formed. |

As shown in Table 3 above, it was confirmed that, in Examples 1 and 2, application to the first plate 10 and transfer to the second plate 20 were performed without a problem, and the wiring pattern of L/S=5 μm could be reliably formed. In contrast, in Comparative Examples 1 and 2, a defective portion was generated in the electrically conductive film formation D on the first plate 10, and the wiring pattern could not be formed. Also, in Comparative Example 3, an unwanted pattern of the electrically conductive film D was not completely transferred from the first plate 10 to the second plate 20, and the electrically conductive pattern D' could not be formed on the first plate 10. In particular, from the result of Comparative Example 3, it was confirmed that even when the value of the static surface tension ($\beta'$) of the liquid composition was smaller than the surface tension ($\alpha$) of the first plate 10, unless the dynamic surface tension ($\beta$) of the liquid composition is smaller than the surface tension ($\alpha$) of the first plate 10, the electrically conductive film D was not formed.

The invention claimed is:

1. A method of forming a pattern comprising:
a first step of forming a liquid-composition coating film by applying a liquid composition onto a first plate;
a second step of forming a pattern on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern; and
a third step of transferring the pattern to a surface of a transfer-receiving substrate by pressing the surface side of the first plate, on which the pattern is formed, onto the surface of the transfer-receiving substrate,
wherein,
when a surface tension of the surface of the first plate, onto which the liquid composition is applied, is represented by $\alpha$, a dynamic surface tension of the liquid composition at 100 msec measured by a maximum bubble pressure method is represented by $\beta$, and a surface tension of the top faces of the projections of the second plate is represented by $\gamma$, the composition of the liquid composition and a material of the surface of the first plate and the second plate is set so as to satisfy $\gamma > \alpha \geq \beta$.

2. The method according to claim 1, wherein the viscosity of the liquid composition is 50 mPas or less.

3. The method according to claim 1, wherein:
the liquid composition contains an electrically conductive material, and in the first step, an electrically conductive film is formed by applying the liquid composition onto the first plate.

4. A method of producing an electronic element comprising:
a first step of forming a liquid-composition coating film by applying a liquid composition onto a first plate;
a second step of forming a pattern on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern; and
a third step of transferring the pattern to a surface of a transfer-receiving substrate by pressing the surface side of the first plate, on which the pattern is formed, onto the surface of the transfer-receiving substrate,
wherein,
when a surface tension of the surface of the first plate, onto which the liquid composition is applied, is represented by $\alpha$, a dynamic surface tension of the liquid composition at 100 msec measured by a maximum bubble pressure method is represented by $\beta$, and a surface tension of the top faces of the projections of the second plate is represented by $\gamma$, the composition of the liquid composition and a material of the surface of the first plate and the second plate is set so as to satisfy $\gamma > \alpha \geq \beta$. thereby producing the electronic element.

5. The method according to claim 4, wherein:
the electronic element is a semiconductor device in which source/drain electrodes, a gate insulating film, and a gate electrode are stacked in that order or in an order reverse to that order on a substrate and a semiconductor layer is provided on an upper layer side or a lower layer side of the source/drain electrodes,
in the first step, an electrically conductive film is formed by applying the liquid composition containing an electrically conductive material onto the first plate,
in the second step, an electrically conductive pattern is formed on the first plate by pressing the second plate onto a surface side of the first plate, on which the electrically conductive film is formed, to transfer an unwanted pattern of the electrically conductive film to top faces of projections of the second plate, thereby removing the unwanted pattern, and
in the third step, the source/drain electrodes or the gate electrode is formed by pressing the surface side of the first plate, on which the electrically conductive pattern is formed, onto a surface of a transfer-receiving substrate to transfer the electrically conductive pattern to the surface of the transfer-receiving substrate.

* * * * *